United States Patent [19]

Kraley et al.

[11] 4,055,803
[45] Oct. 25, 1977

[54] COMBINED WATT AND VAR TRANSDUCER

[76] Inventors: Raymond L. Kraley, 39 Mountain Rise, Fairport, N.Y. 14450; Barry M. Pressman, 129 Clearview Drive, Penfield, N.Y. 14625; Maghar S. Chana, 732 Sugar Creek Trail, Webster, N.Y. 14580

[21] Appl. No.: 726,848

[22] Filed: Sept. 27, 1976
(Under 37 CFR 1.47)

[51] Int. Cl.² ............................................. G01R 21/06
[52] U.S. Cl. ........................................................ 324/142
[58] Field of Search .................. 324/142; 235/151.31, 235/194

[56] References Cited

U.S. PATENT DOCUMENTS

| 3,084,863 | 4/1963 | DuVall | 324/142 X |
| 3,955,138 | 5/1976 | Milkovic | 324/142 X |
| 3,959,724 | 5/1976 | Chana et al. | 324/142 |

Primary Examiner—Stanley T. Krawczewicz
Attorney, Agent, or Firm—Eliot S. Gerber

[57] ABSTRACT

A transducer provides simultaneous indications of watts and vars when connected to a power line. For a single phase power line the transducer utilizes an internal power supply and, in addition, one current transformer, one voltage transformer, one modulator and suitable electronic switches, filters and voltage to current amplifiers.

10 Claims, 3 Drawing Figures

COMBINED WATT AND VAR TRANSDUCER

BACKGROUND OF THE INVENTION

The present invention relates to alternating current power measurement instruments and more particularly to electronic watt transducers and electronic var transducers.

Various types of solid state electronic wattmeters have been proposed and have been alleged to be of greater accuracy than electromechanical instruments, for example, the types shown in the following U.S. Pat. Nos. 3,875,508; 3,662,264; 3,900,794; 3,794,917.

The average power or watts "W" consumed in an element of an electric circuit with a flow of an alternating current, in which voltage E and current I are of the same frequency and are sinusiodal, is equal to EI cos $\theta$, where $\theta$ is the phase angle.

In a single-phase system the reactive power, sometimes called reactive volt amperes, or "vars", is equal to EI sin $\theta$.

It is known that an electronic watt transducer may be converted for alternative use as an electronic var transducer. For example, in U.S. Pat. No. 3,084,863 to W. B. Boast, a relay 110 is operated so that the instrument alternatively reads either watts or vars by switching in a resistor-capacitor network which shifts the incoming voltage by 90°. In U.S. Pat. No. 3,723,872 to H. Rich, either three-phase watts or vars are alternatively measured, depending upon the position of a multiple-pole double-throw switch.

In these instruments the input to the transducer is the power from a power line. The transducer produces an electrical output which is proportional to the amount of electrical power consumed by a load or provided by a source. That output may be utilized in various ways. For example, it may be displayed by a meter or it may be accumulated over time to provide, as in a watt-hour meter, a measure of the amount of electrical energy consumed over time by a load, or provided over time by a source.

SUMMARY OF THE INVENTION

In accordance with the present invention a combined watt and var transducer is provided and adapted to be connected to a power line. The combined watt and var transducer consists of a solid-state electronic circuit which is mounted on an electronics board within an enclosure. The input to the power line has separate connections for the monitoring of current and voltage. The transducer has a current transformer and a voltage transformer and a 90° phase shifter circuit.

A modulator produces an output which varies either with current or voltage, depending on its input connection to either the current or voltage transformer. In one embodiment the modulator is a duty cycle modulator oscillator which utilizes a single operational amplifier whose output is connected through a feedback network to one of the two input terminals of the operational amplifier. Preferably, also, the modulator is provided with a Zener diode or other types of voltage clipping means. Alternative modulators, however, may be used, such as pulse ratio modulators or pulse width modulators.

An electronic switch combines the waveforms from the modulator with the waveforms from the transformer, which is not connected to the modulator. For example, in the case of the duty cycle modulator oscillator, combining the two waveforms has a multiplication effect because it utilizes the area of the pulses, i.e., the width times the height. The pulse train from the electronic switch is filtered by a filter that produces a voltage level which is proportional to watts. That voltage level may be utilized as the input to a voltage to current amplifier.

In a similar manner, a second electronic switch combines the phase shifted waveform from the phase shift circuit with the waveform from the modulator. That combined output if filtered by a second filter which produces a direct current voltage which is proportional to vars. A voltage to current amplifier may convert that voltage (proportional to vars) to a current proportional to vars.

The electronic switches are preferably transistors such as field effect transistors. However, other types of switches may alternatively be used, such as choppers. The phase shift circuit is preferably a 90° phase shift circuit using an operational amplifier as its active element. Alternatively, however, the phase shift circuit may use alternative active elements or may use passive elements such as a resistor-capacitor network. Preferably, each of the filters is a passive resistor-capacitor network. However, alternatively the filter may include either active or other types of passive outputs.

The output voltage level from the filters may be utilized directly to operate a meter. Preferably, however, those voltage levels are converted to a corresponding current level so that it may be transmitted to a utilizing instrument at a different location. For this purpose, each of the watts and vars voltage outputs from the filters may be connected to separate voltage to current amplifiers. Preferably the voltage to current amplifiers are solid-state amplifiers utilizing operational amplifiers and which are part of the electronic circuitry within the enclosure. The utilizing instrument may, for example, be an A/D converter or a recording meter.

FEATURES OF THE INVENTION

It is a feature of the present invention to provide a watt and var transducer adapted to be connected to a single phase power line or, along with a second watt and var transducer of the same type, adapted to be connected to a three-phase power line. It comprises a single voltage transformer (for the measurement of voltage) and a single current transformer (for the measurement of current). A phase shift circuit is connected to either the voltage transformer or, alternatively, the current transformer. A single modulator has its input terminal connected to the other one of the voltage transformer and the current transformer. The transducer further comprises a first electronic switch means having input terminals connected to the phase shift circuit and to the modulator, which first electronic switch means combines the waveforms from the phase shift circuit and said modulator. A first filter, having an input terminal, is connected to the first electronic switch and the first filter has an output terminal at which the direct current voltage is proportional to vars on said power line. A second electronic switch means, having input terminals, is connected to the other one of the voltage transformer and the current transformer and also connected to the modulator. That second electronic switch combines the unshifted waveforms from the other one of said current transformer and voltage transformer and the waveforms from said modulator. A second filter, having an input terminal, is connected to the second electronic switch and has an output at which the direct current voltage is proportional to watts on the said power line.

It is a further feature of the present invention to provide such a combined watt and var transducer in which the modulator is a duty cycle oscillator. The combined transducer may also include a first voltage to current amplifier having an input terminal connected to the output terminal of the first filter and a second voltage to current amplifier having an input terminal connected to the output terminal of the second filter.

OBJECTIVES OF THE INVENTION

It is an objective of the present invention to provide a transducer which is a combined watt and var transducer which will provide simultaneous outputs at its output terminals which are proportional to the watts and vars consumed by the load.

It is a further objective of the present invention to provide such a combined watt and var transducer in a single enclosure of relatively small size.

It is a further objective of the present invention to provide such a watt and var transducer which is of solid-state electronics and which is relatively accurate over a broad range of external temperature variations.

It is a further objective of the present invention to provide such a combined watt and var transducer which is relatively low in cost.

It is a further objective of the present invention to provide such a combined watt and var transducer which requires relatively fewer external connections compared to the use of separate watt and var transducers.

It is a further objective of the present invention to provide such a combined watt and var transducer which provides electrical isolation between its I,V input terminals and between its input and output terminals and between its input terminals and its power supply terminals.

It is a further objective of the present invention to provide such a combined watt and var transducer which provides separate calibration adjustments for its watt and var sections.

It is a further objective of the present invention to provide such a combined watt and var transducer which has common inputs for its watt and var outputs, thereby reducing the cost and complexity or wiring the transducer into the power circuitry.

It is a further objective of the present invention to provide such a combined watt and var transducer which, when utilized with a single-phase power line, requires only a single current transformer, thereby reducing the size, cost and complexity of the transducer compared to the alternative of separate watt and var transducers.

It is a further objective of the present invention to provide such a combined watt and var transducer which, when utilized with a single-phase power line, requires only a single voltage transfomer, which comparatively reduces the cost, complexity and size of the transducer.

It is a further objective of the present invention to provide such a combined watt and var transducer which, when utilized with a single-phase power line, requires only a single power transformer and a single direct current power supply, which comparatively reduces the cost, complexity and size of the transducer.

BRIEF DESCRIPTION OF THE DRAWINGS

Other features and objectives of the present invention will be apparent from the detailed description of the present invention which follows this brief description of the drawings. That detailed description provides the inventor's best presently known mode of practicing the invention and should be considered in conjunction with the accompanying drawings.

In the drawings.

DETAILED DESCRIPTION OF THE INVENTION

Figure 1:
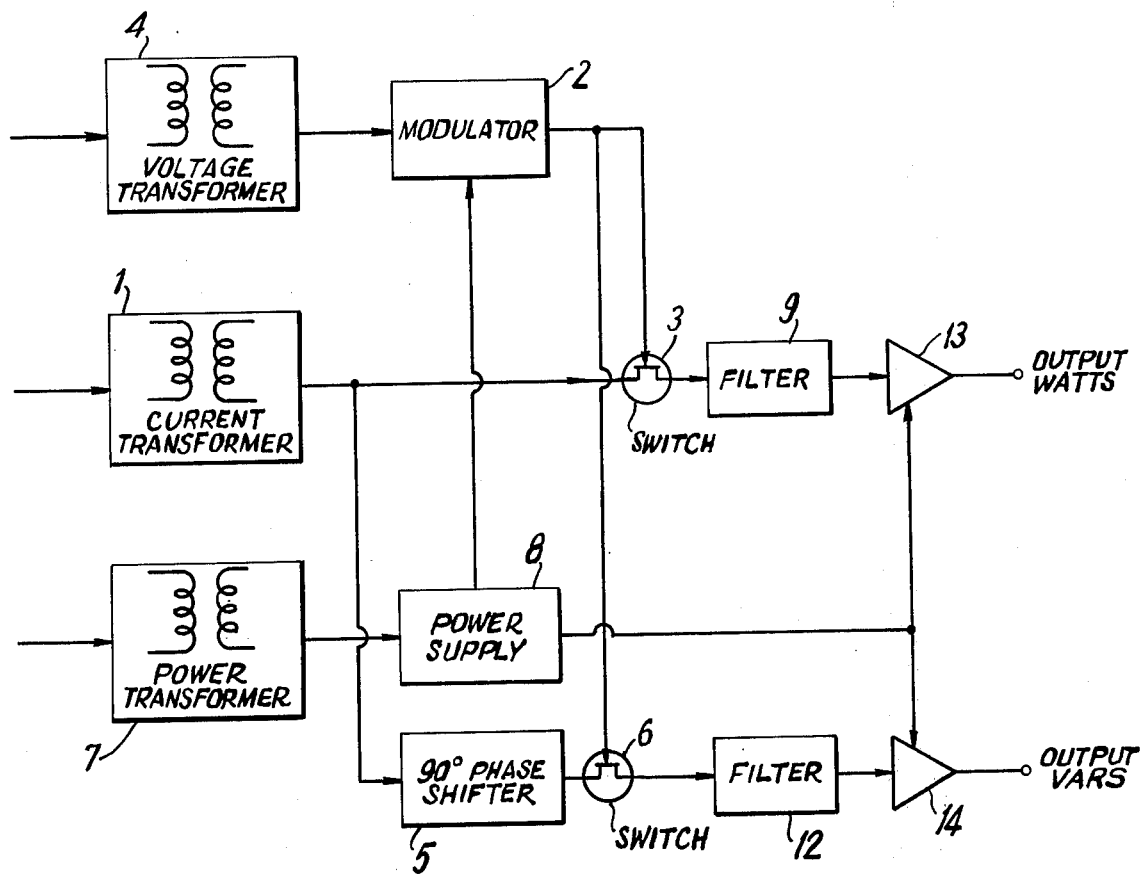
FIG. 1 is a block diagram illustrating the present invention of a combined watt and var transducer applied to a single-phase power line.

FIG. 1 is a block diagram which illustrates the principles of the present invention as applied to the measurement of power on a single phase alternating current line consisting of two wires from which current voltage and power are derived.

The combined watt and var transducer uses only two transformers to produce an output proportional to watts and vars and an additional optional transformer for its internal power supply. A voltage transformer 4 has its primary winding connected to the power line and its secondary winding produces a voltage which is proportional to the voltage on that line. That proportional voltage is modulated by modulator 2, whose output is connected to an electronic switch 3. A current transformer 1 has its primary winding connected to the power line and its secondary winding produces a current which is proportional to the current on that line. The secondary winding of current transformer 1 is connected to the input of the switch 3 and is also connected to the input to a 90° hase shifter 5. The phase shifter 5 is connected to the input of a second electronic switch 6, which is controlled by the output of the modulator 2.

The primary winding of power transformer 7 is connected to the power line and its secondary winding is connected to rectifiers and filters to provide a direct current power supply 8. The d.c. power supply 8 is connected to the various sub-circuits.

The electronic switch 3 combines the two proportional signals, representing current and voltage, and produces a combined signal in which current is multiplied by voltage. The electronic switches 3,6 may each be a transistor whose control electrode is connected to the output of the modulator 2 so that the modulator pulse's zero crossings change the state of the transistor. The pulse train at the output of the electronic switch 3 has the amplitude of each pulse determined by the current amplitude and its duty cycle determined by the voltage amplitude. That combined signal, from electronic switch 3, represents watts of power. The switch 3 is connected, through filter 9, to amplifier 13. The filter 9 reacts to the total power of the pulse train from electronic switch 3 and produces a direct current output which is proportional to the average a.c. power, in watts, on the single-phase power line.

Similarly, the electronic switch 6 is connected, through filter 12, to amplifier 14. The filter 12 reacts to the total power of the pulse train from electronic switch 6 and produces a direct current output which is proportional to the average a.c. power, in vars, on the single-phase power line.

In operation, the single phase power line supplies alternating current to current transformer 1 and alternating voltage to voltage transformer 4. The current waveform is shifted 90° by phase shifter 5.

The modulator 2 is preferably a duty cycle modulator oscillator which produces a rectangular wave output. The duty cycle of the rectangular wave output is changed by the voltage so that when the voltage rises the "on" time decreases, i.e., the width of the rectangular wave pulses decreases. The amplitude of the output rectangular wave of the oscillator is kept constant, but the duty cycle of output changes and carries the input information. A change in frequency of oscillation does not cause any error. The zero crossings of the pulse train (the duty cycle) are determined by the amplitude of the voltage waveform from transformer 4. The duty cycle modulated oscillator is an operational amplifier having a feedback path and two reference Zener diodes (temperature compensated Zener diodes) to provide for clipping of the rectangular waveform.

The electronic switch 3 combines the waveforms, the rectangular wave pulses from the duty cycle modulator 2, with the waveforms from the current transformer. The modulator 2 determines the on/off ratio (duty cycle) of the combined waveforms, and the amplitude of the waveform from switch 3 is determined by the current. Alternatively, the modulator 2 may be connected to the current transformer and the amplitude of the waveform would then be determined by the waveform from the voltage transformer. The combination of waveforms by switch 3 is a multiplication effect because it utilizes the area of the pulses, i.e., the width times the height. The pulse train from the electronic switch 3 is filtered by filter 9 to produce a voltage level which is proportional to watts. That voltage level is the input to a voltage to current amplitude 13. Consequently, the current output, at the output terminals, is proportional to the watts on the single phase power line.

Similarly, the electronic switch 6 combines the phase shifted current waveform (which determines the amplitude of the combined pulses) with the pulses from the modulator 2, the duty cycle of those pulses being determined by the voltage from the voltage transformer. That combined waveform from switch 6 is filtered by filter 12 and produces a direct current voltage which is proportional to vars. That voltage, proportional to vars, is converted to a current proportional to vars by the voltage to current amplifier 14.

Figure 2:
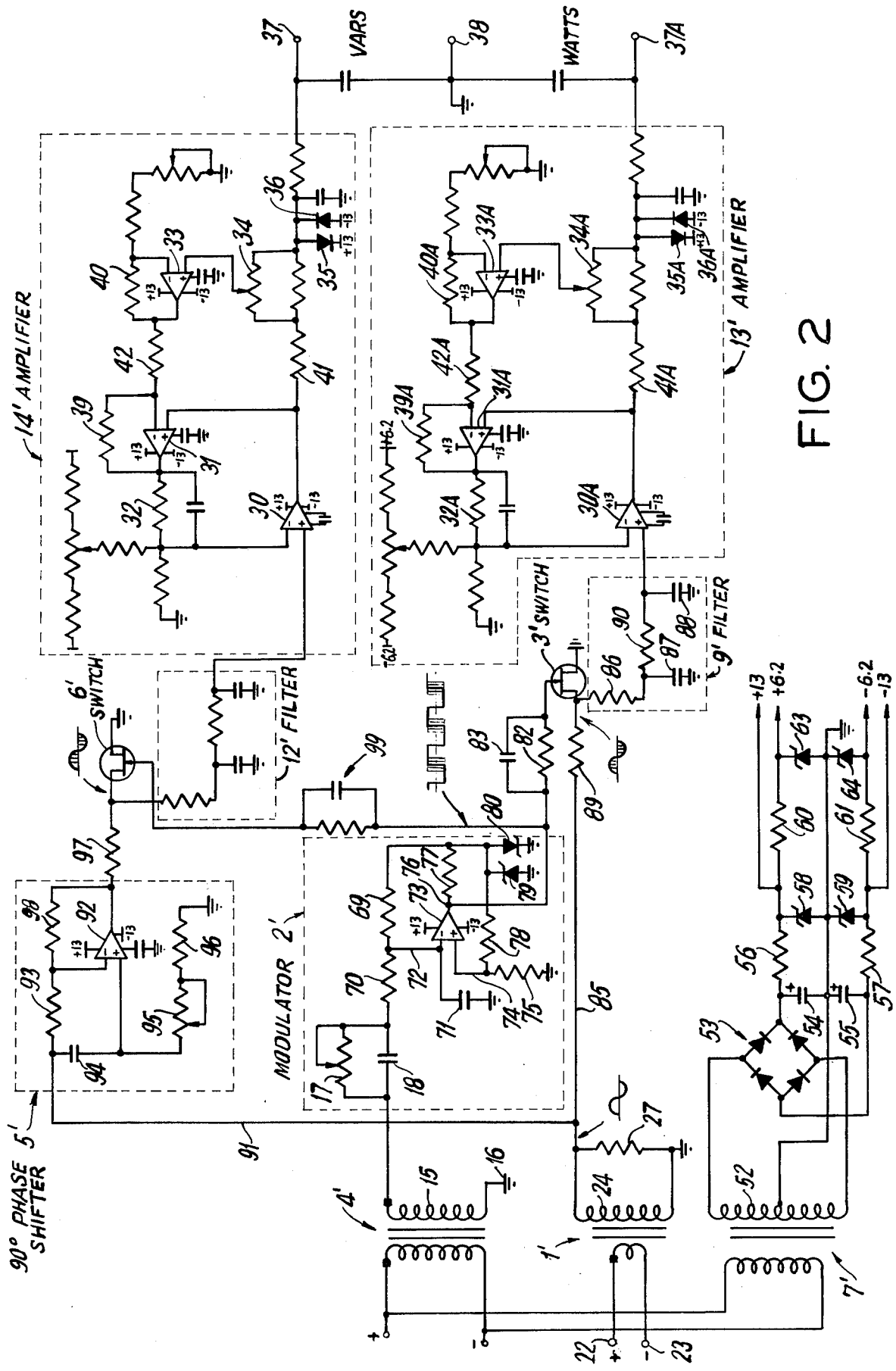
FIG. 2 is a schematic diagram of one embodiment of specific electronic circuits that are suitable for use in connection with the block diagram of FIG. 1.

FIG. 2 is a schematic diagram illustrating a combined watt and var transducer which is utilized with a single-phase power system and is consistent with the block diagram of FIG. 1. A transformer plate is provided within an enclosure and a separate electronics board is also provided within the same enclosure. Three separate transformers are mounted on the transformer plate, including voltage transformer 4' whose primary winding is connected to the voltage terminals. The secondary winding 15 of the voltage transformer 4' has one of its terminals connected to ground 16 and the other of its terminals connected through an adjustable resistor 17 and capacitor 18 to the modulator 2'. The capacitor 18 and resistor 17 comprises an adjustable phase correction unit.

A current transformer 1' has its primary winding connected to the terminals 22 and 23, which terminals 22 and 23 are connected respectively to the single-phase power line. The secondary winding 24 of current transformer 1' has its ends connected respectively to the ground 16 and across a resistor 27 and by means of line 91 to a 90° phase shift network 5'. The third transformer 7', which is a power transformer, is the power supply transformer and also has its primary winding connected to the single-phase power line. The secondary winding 52 of the transformer 7' is tapped at its center, and its ends and its center tap are connected to a full-wave rectifying bridge.

The full-wave rectifier 53 is a bridge network consisting of four rectifying solid-state diodes. The output of the rectifier 53 is taken across two capacitors 54 and 55 through two resistors 56 and 57 and across two voltage regulating Zener diodes 58 and 59. The output is further reduced and controlled by resistors 60 and 61 and two additional voltage regulating Zener diodes 63 and 64. The outputs of the power supply are, as indicated, positive 13 volts, positive 6.2 volts, negative 13 volts and negative 6.2 volts. It will be understood, however, that, although one preferred power supply is shown, other types of power supplies may alternatively be used to power the electronics of the remainder of the circuit.

The modulator 2' is a common modulator utilized for both the watt and var switches. The description set forth in this paragraph will relate specifically to the duty cycle modulated oscillator 2' shown in FIG. 2. However, it will be understood that other types of duty cycle modulators and pulse width modulators may alternatively be utilized. The modulator 2' includes an input resistor 70 and an input capacitor 71 whose opposite end leads to the ground 16. The input line 72 is the negative (inverting) input of a linear operational amplifier 73. The operational amplifier 73 is preferably an integrated circuit and is a very high gain direct coupled amplifier, as are the other operational amplifiers of the circuit.

The positive (non-inverting) input terminal 74 of the operational amplifier 73 is connected to a resistor 75 whose opposite end is connected to the ground 16. The output terminal 76 of the operational amplifier 73 is connected through the resistors 77 and 78 to its positive input terminal 74. The output terminal 76 is connected, through resistor 77 and resistor 69, for example, of 90.9 K ohms, to the negative (inverting) input terminal 72.

The output terminal 76 is connected, through the resistor 77, to two voltage regulating Zener diodes 79 and 80 which are oppositely poled and provide upper and lower clipping points, i.e., upper and lower amplitude limits on the output pulses from the operational amplifier 73. The opposite ends of the respective Zener diodes 79 and 80 are connected to the ground 16. The resistor 77 is of low value, for example, 750 ohms, and the resistor 78 is of a relatively high value, for example, 10 K ohms.

The zero crossing points of the leading edges of the pulses at the output of the modulator 2' may be considered a quiescent signal edge. That quiescent signal edge is modulated either forward to make the pulse wider (upon a negative input) or rearward to make the pulse more narrow (upon a positive input). In other words, on a negative input the space between pulses will be decreased and the duty cycle ratio, the ratio of on/off, will rise. The amplitude of the pulses will remain the same as they have been clipped (limited) by the Zener diodes 79,80. Since the output is averaged over time by the filter 9', changes in frequency or changes in the width of the output pulses at quiescent zero voltage input would not have any effect on the averaged output because the changed frequency, or changed nominal pulse width, will equally affect the positive and negative excursions of the waveform and will consequently be canceled out and have no effect on the averaged output.

The output terminal 76, which is the output of the modulator 2', is connected through a resistor-capacitor network comprising resistor 82 and capacitor 83 to the electronic switch 3'. The electronic switch 3' is preferably a field effect transistor in which the gate (the control element) is connected to the duty cycle modulator 2' and the drain is connected to the current input and the source is connected to ground 16.

The output of the electronic switch 3' is to a filter 9' consisting of resistors 86,90 and capacitors 87 and 88. A line 85 connects the secondary winding 24 of the transformer 1' to the switch 3' through resistor 89. The output of filter 9' is a direct current voltage whose level is proportional to the watts being measured.

The output of the filter 9' is to a direct voltage to current amplifier 13' which converts the input direct voltage to an output current proportional to that input voltage. That current output is proportional to the watts on the single-phase power line. The output current is suitable for transmission or for use by other instruments, such as recording devices and, for example, may be in the range of 0-1 milliampere when connected to a load of 0-10 K ohms.

The phase shifter 5' is connected to the current transformer 1' by line 91. The 90° phase shifter 5' includes an operational amplifier 92 whose negative (inverting) input is connected to line 91 through resistor 93. The positive (non-inverting) input of amplifier 92 is connected to capacitor 94 which is also connected to line 91. The positive input is connected to ground through variable resistor 95 and resistor 96. Its output is connected through resistor 98 to its negative input for negative feedback and through resistor 97 to a second electronic switch 6', which is a field effect transistor. The control electrode of electronic switch 6' is connected to the output of the common modulator 2' through resistor-capacitor network 99. The output of electronic switch 6' is to a filter 12', comprising two resistors and two capacitors. The output of filter 12' is to a voltage to current amplifier 14'. The output of the filter 12' is a direct current which is proportional to the vars on the power line. A current proportional to that d.c. voltage is produced by means of amplifier 14'. The output current of amplifier 14' is in the range 0-1 milliampere when connected to a load of 0-10 K ohms.

Each of the two voltage to current amplifier 14' and 13' is of the same circuitry. The description will be of amplifier 14' and it will be understood that the amplifier 13'has the same parts, its corresponding parts being numbered with the suffix letter A following the number.

In amplifier 14' the direct current voltage input is to the positive (non-inverting) input terminal of linear operational amplifier 30. A feedback path from the output terminal of linear operational amplifier 30 leads to the positive (non-inverting) input terminal of operational amplifier 31 and from the output of amplifier 31 through resistor 32 back to the negative input terminal of amplifier 30. The operational amplifier 31 has a feedback, through resistor 39, to its negative input. A third operational amplifier 33 has a feedback to its negative input terminal through resistor 40 and has its positive terminal connected, through variable resistor 34 and resistor 41, to the output terminal of operational amplifier 30. The output terminal of operational amplifier 33 is connected, through resistor 42, to the negative input terminal of operational amplifier 31.

A pair of oppositely poled rectifier diodes 35, 36 are provided for transient damage protection. The output current, which represents vars, is taken at the output terminal 37 and common (ground) terminal 38. The output current, which represents watts, is taken at the output terminal 37A and the common output terminal 38.

Figure 3:
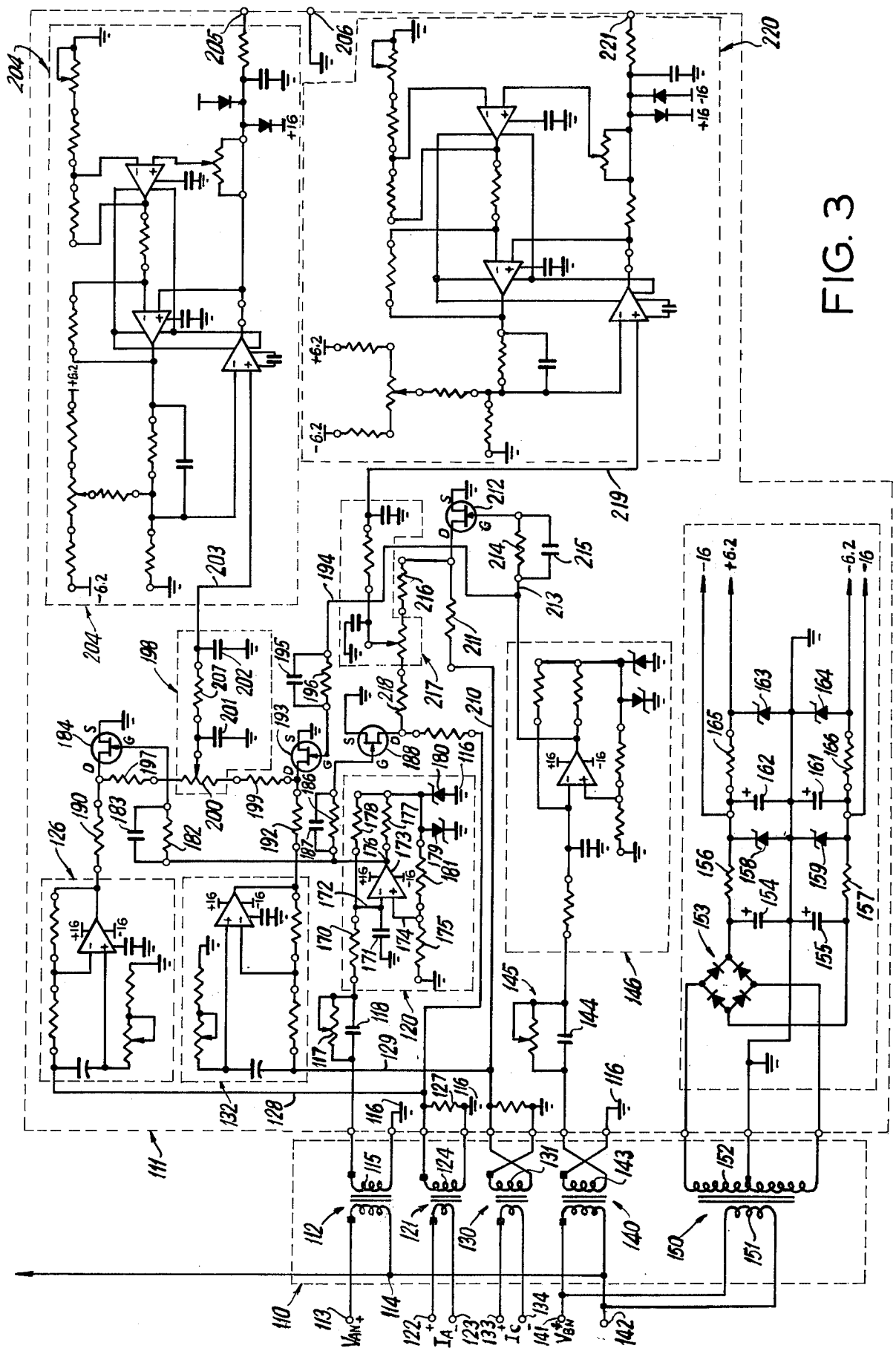
FIG. 3 is a schematic diagram of a three-phase combined watt and var transducer according to the present invention.

As shown in FIG. 3, a transformer plate 110 is provided within an enclosure and a separate electronics board 111 is also provided with the same enclosure. A number of separate transformer windings are mounted on the transformer plate 110, including the transformer 112, which is a voltage transformer whose primary is connected to the voltage terminals 113 and 114. The secondary winding 115 of the transformer 112 has one of its terminals connected to ground 116 and the other of its terminals connected to a duty cycle modulator 120 through a phase correction unit comprising an adjustable resistor 117 and capacitor 118.

A second transformer 121 has its primary winding connected to the terminals 122 and 123, which terminals 122 and 123 are connected respectively to the three phase power line. The transformer 121 is a current transformer and its secondary winding 124 has its ends connected respectively to the ground 116 and across a resistor 127 to a 90° phase shift network 126 by means of line 128. A third transformer 130, which is a current transformer, has its primary winding connected to the respective positive 133 and negative 134 terminals of a second current input. The secondary winding 131 of the transformer 130 is crossed and one of its ends is connected to ground 116 and the opposite end is connected to a second 90° phase shift network 132 by line 129.

A fourth transformer 140 is a voltage transformer and has its primary winding connected to the voltage input terminals 141 and 142. The secondary winding 143 of the transformer 140 has its output leads crossed and one of those leads is connected to the ground 116 and the other of its leads is connected through the capacitor 144 and the variable resistor 145 to the second modulator 146. The fifth transformer 150, a voltage transformer which is utilized to provide a power supply, has its primary winding 151 connected to the terminals 141 and 142, which provide a voltage input. The secondary winding 152 of the voltage transformer 150 has a center tap and two end taps, all three of which taps are connected by wires to a full-wave bridge rectifier 153 consisting of four rectifying solid-state diodes. The output of the bridge rectifier 153 is taken across two capacitors 154 and 155 through two resistors 156 and 157 and across two voltage regulating Zener diodes 158 and 159. The output is decreased in voltage and controlled by a capacitor-resistor network comprising capacitors 161, 162 and resistors 165, 166 and two additional voltage regulating Zener diodes 163 and 164. The outputs of this power supply, as indicated, is plus 16 volts, plus 6.2 volts, 6.2 negative and negative 16 volts. It will be understood, however, that, although one preferred power supply is shown, other types of power supplies may alternatively be used to power the remainder of the circuit.

The two duty cycle modulators 120 and 146 are alike and are similar to the modulator 2' of FIG. 2. The description set forth in this paragraph will relate specifically to the modulator 120, but it is equally applicable to the modulator 146. The duty cycle modulator 120 includes an input resistor 170 and an input capacitor 171 whose opposite end leads to the ground 116. The input line 172 is the negative input terminal of a linear operational amplifier 173. The positive input 174 of the linear operational amplifier 173 is connected to a resistor 175 whose opposite end is connected to the ground 116.

The output terminal 176 of the operational amplifier 173 is connected through the resistors 177 and 178 to its negative input (inverting) terminal 172. The output terminal 176 is connected through the resistor 177 to two voltage regulating Zener diodes which are oppositely poled and provide upper and lower clipping points or limits on the output pulse train and through resistor 181 to positive input terminal 174. The opposite ends of the respective Zener diodes 179 and 180 are connected to the ground 116. A large resistor 181, for example, of 100 K ohms, is positioned between the input terminal 174 and the resistor 177. The resistor 177 is of low value, for example, 845 ohms, and the resistor 178 is of a relatively high value, for example, 90 K ohms. The output terminal 176 of the modulator 120 is connected through the resistor-capacitor network comprising resistor 182 and capacitor 183 to the control electrode of electronic switch 184, which is a field effect transistor.

The line 128 leads to the 90° phase shift circuit 126. The phase shift circuit 126 and the 90° phase shift circuit 132 are of the same type and include the same components as the 90° phase shift circuit 5' described previously in connection with FIG. 2. The output of the phase shift circuit 126, through the resistor 190, it to an input terminal of the electronic switch 184. The electronic switch 184 is a field effect transistor and the connected input terminal is its drain electrode. The phase shift circuit 126 provides a waveform which is representative of current and with a 90° phase shift. Similarly, the 90° phase shift circuit 132 receives a waveform representative of current from the secondary winding 131 of the transformer 130 by means of line 129. The phase shift circuit 132 is connected, through resistor 192, to an input terminal of the electronic switch 193.

A second modulator 146 is of the same construction and components as the previously described modulator 120. The modulator 146 is a duty cycle modulator oscillator and its input is a waveform representative of voltage from the secondary winding 143 of voltage transformer 140. The modulator 146 is connected, by means of line 194 and through the capacitor 195 and resistor 196, to the control electrode of the electronic switch 193.

The output of the switch 184 is connected through the resistor 197 to the filler 198. Similarly, the output from the switch 193 is connected through the resistor 199 to the same filter 198. The filter 198 combines and averages the outputs from the two switches 184 and 193 and produces a voltage level which is representative of vars. The filter 198 includes resistors 200 and 207 and the capacitors 201 and 202. The output of the filter 198 on line 203 is to a voltage to current amplifier 204. The current level proportional to vars is taken at the output terminals 205, 206.

The secondary winding 131 of the transformer 130 is connected by means of the line 210 and resistor 211 to an input terminal of an electronic switch 212. The output of the modulator 146 is connected by means of the line 213 and through the resistor-capacitor network, comprising resistor 214 and capacitor 215, to the control electrode of the electronic switch 212. The output of the electronic switch 212 is connected through the resistor 216 to the filter 217. The modulator 120 is connected to the control electrode, the gate of an FET, of the electronic switch 188 through capacitor 187 and resistor 186. The output of switch 188 is to filter 217 through resistor 218. The components of the filter 217 are similar to those of the filter 198. The output of the filter 217, which combines and averages waveforms, is to the voltage to current amplifier 220. The voltage to current amplifier 220, at its output terminals 221 and 206, produces a current which is representative of watts on the three-phase power line.

The construction and components and functions of the voltage to current amplifiers 204 and 220 are the same as that of the voltage to current amplifiers 13' and 14' described in connection with FIG. 2. The measurement of watts at the terminals 206 and 221 is a measurement of the total power in watts from the three-phase power line. Similarly, the measurement of vars at the output terminals 205 and 206 is a measurement of the total power in vars on the three-phase power line. Each of the measurements of watts and vars may be taken simultaneously, although it is possible to measure watts without measuring vars and to measure vars without measuring watts. In unbalanced polyphase systems a simultaneous measurement of total watts and total vars is required to determine the vector power factor.

Modifications may be made in the subject invention within the scope of the subjoined claims. For example, one or more of the voltage transformers may be replaced by alternative voltage reduction circuits, such as a capacitor-divider or a resistor divider. The term "voltage transformer means," as used herein, refers to a voltage transformer or a voltage divider when used to produce a voltage which varies directly and in proportion to the voltage being measured.

The watt and var transducer described in connection with FIGS. 1 and 2 may be used with a three-phase three-wire connection by changing the external connections. In that case the power transformer 7' may be connected to the A and C lines, the voltage transformer 4' connected to the A line and the current transformer 1' connected to the C line.

The watt and var transducer of the present invention may also be used for connection to a three-phase four-wire power line, the wires being labeled A,B,C, neutral. In that case, in effect, three of the transducers shown in FIGS. 1 and 2 are utilized, each comprising a voltage transformer, a current transformer, a modulator, a phase shift circuit and two electronic switches. The first such transducer is connected to lines A, neutral; the second to lines B, neutral; and the third to lines C, neutral. Each of the watt and var outputs are added together by three adders to produce watt and var outputs having a common output terminal at ground potential.

What is claimed is:

1. A watt and var transducer for the simultaneous indication of watts and vars comprising, within the same enclosure, a single voltage transformer means for the measurement of voltage and a single current transformer for the measurement of current;

a phase shift circuit connected to one of said voltage transformer means and said current transformer;

a single modulator having an input terminal connected to the other one of the said voltage transformer means and the said current transformer;

a first electronic switch means having input terminals connected to said phase shift circuit and said modulator, said first electronic switch means combining the waveforms from said phase shift circuit and said modulator;

a first filter having an input terminal connected to said first electronic switch and an output terminal at which the direct current voltage is proportional to vars on said power line;

a second electronic switch means having first and second input terminals and having its first input terminal connected to the same one of said voltage transformer means and said current transformer which is connected to said phase shift circuit, said second electronic switch having its second input terminal connected to said modulator, said second electronic switch combining the unshifted waveforms from the said one of said current transformer and voltage transformer means and the waveforms from said modulator; and a second filter having an input terminal connected to said second electronic switch and an output at which the direct current voltage is proportional to watts on the said power line.

2. A watt and var transducer as in claim 1 wherein said modulator is a duty cycle oscillator.

3. A watt and var transducer as in claim 1 and including a first voltage to current amplifier having an input terminal connected to the output terminal of said first filter and a second voltage to current amplifier having an input terminal connected to the output terminal of said second filter.

4. A watt and var transducer as in claim 1 and further including a power supply within the said enclosure comprising a single transformer and rectifying means for producing a direct current from an alternating current.

5. A watt and var transducer for a three phase power line comprising a first and a second voltage transformer means for the measurement of voltage and a first and a second current transformer for the measurement of current;

a first phase shift circuit connected to one of said first voltage transformer and said first current transformer;

a second phase shift circuit connected to one of said second voltage transformer and said second current transformer;

a first and a second modulator each having an input terminal connected to a separate one of the other one of the said voltage transformers and the said current transformers;

a first electronic switch means having input terminals connected to said first phase shift circuit and to said first modulator;

a second electronic switch means having input terminals connected to said second phase shift circuit and to said second modulator, each of said first and second electronic switch means combining the phase shifted waveforms from the one of said phase shift circuits to which it is connected and the waveforms from the one of said modulators to which it is connected;

a first filter having an input terminal connected to said first electronic and said second electronic switches and an output terminal at which the direct current voltage is proportional to vars on said power line;

a third electronic switch means having input terminals connected to one of said other one of said first voltage transformers and said first current transformer and connected to said first modulator;

a fourth electronic switch means having input terminals connected to one of said other one of said second voltage transformers and said second current transformers and connected to said second modulator, each of said third and fourth electronic switch means combining the phase unshifted waveforms from the one of said transformers to which it is connected and the waveforms from the one of said modulators to which it is connected; and a second filter having an input terminal connected to said third and fourth electronic switches and an output terminal at which the direct current voltage is proportional to watts on the said power line.

6. A watt and var transducer as in claim 5 wherein each of said modulators is a duty cycle oscillator.

7. A watt and var transducer as in claim 5 and including a first voltage to amplitude amplifier having an input terminal connected to the output terminal of said first filter and a second voltage to amplitude amplifier having an input terminal connected to the output terminal of said second filter.

8. A watt and var transducer as in claim 4 wherein said rectifying means includes a full-wave diode bridge rectifier.

9. A watt and var transducer as in claim 5 and further including a power supply within the said enclosure comprising a single transformer and rectifying means for producing a direct current from an alternating current.

10. A watt and var transducer as in claim 7 having one of its output terminals which is common to both outputs or is internally tied to the same potential conductor.

* * * * *